US007598810B2

(12) United States Patent
Chao et al.

(10) Patent No.: US 7,598,810 B2

(45) Date of Patent: Oct. 6, 2009

(54) POWER AMPLIFIER HAVING INPUT ENDS COMBINED IN SERIES AND OUTPUT ENDS COMBINED IN SERIES

(75) Inventors: Shih-Fong Chao, Taipei (TW); Zuo-Min Tsai, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 2 days.

(21) Appl. No.: 12/134,137

(22) Filed: Jun. 5, 2008

(65) Prior Publication Data

US 2009/0115529 A1 May 7, 2009

(30) Foreign Application Priority Data

Nov. 5, 2007 (TW) ............................. 96141638 A

(51) Int. Cl.
*H03F 3/68* (2006.01)

(52) U.S. Cl. ...................................... 330/295; 330/311

(58) Field of Classification Search ................. 330/295, 330/124 R, 84, 126, 311, 165, 276
See application file for complete search history.

(56) References Cited

U.S. PATENT DOCUMENTS

| | | | | |
|---|---|---|---|---|
| 3,134,913 | A * | 5/1964 | Pederson | 327/309 |
| 3,542,953 | A * | 11/1970 | Munch, Jr. | 381/117 |
| 3,652,947 | A * | 3/1972 | Hollingsworth | 330/276 |
| 7,486,141 | B2 * | 2/2009 | Do et al. | 330/276 |
| 7,511,578 | B2 * | 3/2009 | Dupuis et al. | 330/311 |

* cited by examiner

*Primary Examiner*—Henry K Choe
(74) *Attorney, Agent, or Firm*—Schmeiser, Olsen & Watts, LLP

(57) ABSTRACT

A power amplifier includes a first transformer, a first transistor, a first resistor, a second transformer, a second transistor, a second resistor, and a bias circuit. The first transformer drives the first transistor. The second transformer drives the second transistor. The first transformer is connected in series with the second transformer. The first transistor is connected in series with the second transistor. Therefore, the power amplifier has input impedance and output power both greater than those of a conventional power amplifier.

3 Claims, 2 Drawing Sheets

POWER AMPLIFIER HAVING INPUT ENDS COMBINED IN SERIES AND OUTPUT ENDS COMBINED IN SERIES

FIELD OF THE INVENTION

The present invention relates to power amplifiers, and more particularly, to a power amplifier with input ends combined in series and output ends combined in series.

BACKGROUND OF THE INVENTION

Power amplifiers are often provided at a front end of a microwave communication system, for providing high output power. Limited by the rated breakdown voltage and operating current of transistors, the power amplifiers usually have to include a plurality of transistors so as to increase the operating voltage and current of the power amplifiers.

"Microwave Transistor Amplifiers, Analysis and Design, $2^{nd}$ edition" (Chapter 3, Upper Saddle River, N.J.: Prentice Hall, 1997, Guillermo Gonzalez) discloses a power amplifier having a plurality of transistors. The transistors have input ends connected in parallel with each other, and output ends connected in parallel with each other. As such, the input ends of the transistors have the same potential and current, and the output ends of the transistors also have the same potential and current. However, since these transistors are connected in parallel with each other, currents flowing through the power amplifier are inevitably large, thereby causing a large line loss. Moreover, the input and output impedances of the power amplifier are very small, thus making the design of the power amplifier more challenging and difficult.

U.S. Pat. Nos. 6,888,396 and 5,867,061 disclose another power amplifier having a plurality of transistors. Although the input ends of this power amplifier are again connected in parallel with each other, this configuration is different from the above in that the output ends are now combined in series. Accordingly, the currents coming out of the output ends of the power amplifier remain the same, but the voltage is increased, thus achieving good power combination efficiency. However, since the input ends of the power amplifier are still combined in parallel with each other, the input impedance thereof is still too small to allow easy designing. In addition, "Transformer coupled stacked FET power amplifier" (*IEEE Journal of Solid State Circuits,* vol. 34, no. 2, pp. 157-161, February 1999, John G. Mcrory, Gordon G. RabJohn, and Ronald H. Johnston), "Fully integrated CMOS power amplifier design using the distributed active transformer architecture" (vol. 37, issue 3, pp. 371-383, March 2002, I. Aoki, S. D. Kee, D. B. Rutledge, A. Hajimiri), "A 2.4-GHz, 2.2-W, 2-V fully-integrated CMOS circular-geometry active-transformer power amplifier" (*IEEE conference on Custom Integrated Circuits* 2001, pp. 215-218, I. Aoki, S. D. Kee, D, Rutledge, A. Hajimiri), and U.S. Pat. Nos. 6,816,012 and 6,856,199 also disclose similar power amplifiers.

"A new power amplifier topology with series biasing and power combining of transistors" (1992 IEEE Microwave and Millimeter-Wave Monolithic Circuits Symposium Digest, pp. 39-41, 1-3 Jun. 1992, M. Shifrin, Y. Ayasli and P. Katzin) and "The high voltage/high power FET" (*IEEE RFIC Symp. Dig.,* 2003, pp. 215-218, A. K. Ezzeddine and H. C. Huang) disclose yet another power amplifier. The output ends of this power amplifier are also combined in series. However, the input ends of this power amplifier are designed such that all the powers are applied to the first transistor. Although such power amplifier may have large input impedance, the parasitic effect of the transistors cannot be neglected when the power amplifier is operating in a high frequency. As a result, the power combination efficiency of such power amplifier is greatly reduced.

SUMMARY OF THE INVENTION

In light of the foregoing drawbacks in the prior art, an objective of the present invention is to provide a power amplifier having input impedance and output power both larger than those of a conventional power amplifier.

In accordance with the above and other objectives, the present invention provides a power amplifier, which includes: a first transformer comprising a first primary coil for receiving an input signal, and a first secondary coil; a first transistor comprising a first base, a first collector and a first emitter, the first emitter being coupled to a first end of the first secondary coil, and the first emitter being grounded and coupled to a second end of the first secondary coil; a first resistor coupled between the first base and the first collector; a second transformer comprising a second primary coil and a second secondary coil, a first end of the second primary coil being coupled to a second end of the first primary coil, and a second end of the second primary coil being grounded; a second transistor comprising a second base, a second collector for generating an output signal, and a second emitter, the second base being coupled to a first end of the second secondary coil, and the second emitter being coupled to the first collector and a second end of the second secondary coil; a second resistor coupled between the second base and the second collector; and a bias circuit having a first end coupled to the second collector, and a second end for receiving a supply voltage.

In a preferred embodiment of the present invention, the power amplifier may further include a first capacitor coupled between the first end of the first secondary coil and the first base.

In a preferred embodiment of the present invention, the bias circuit is an inductor.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 1:
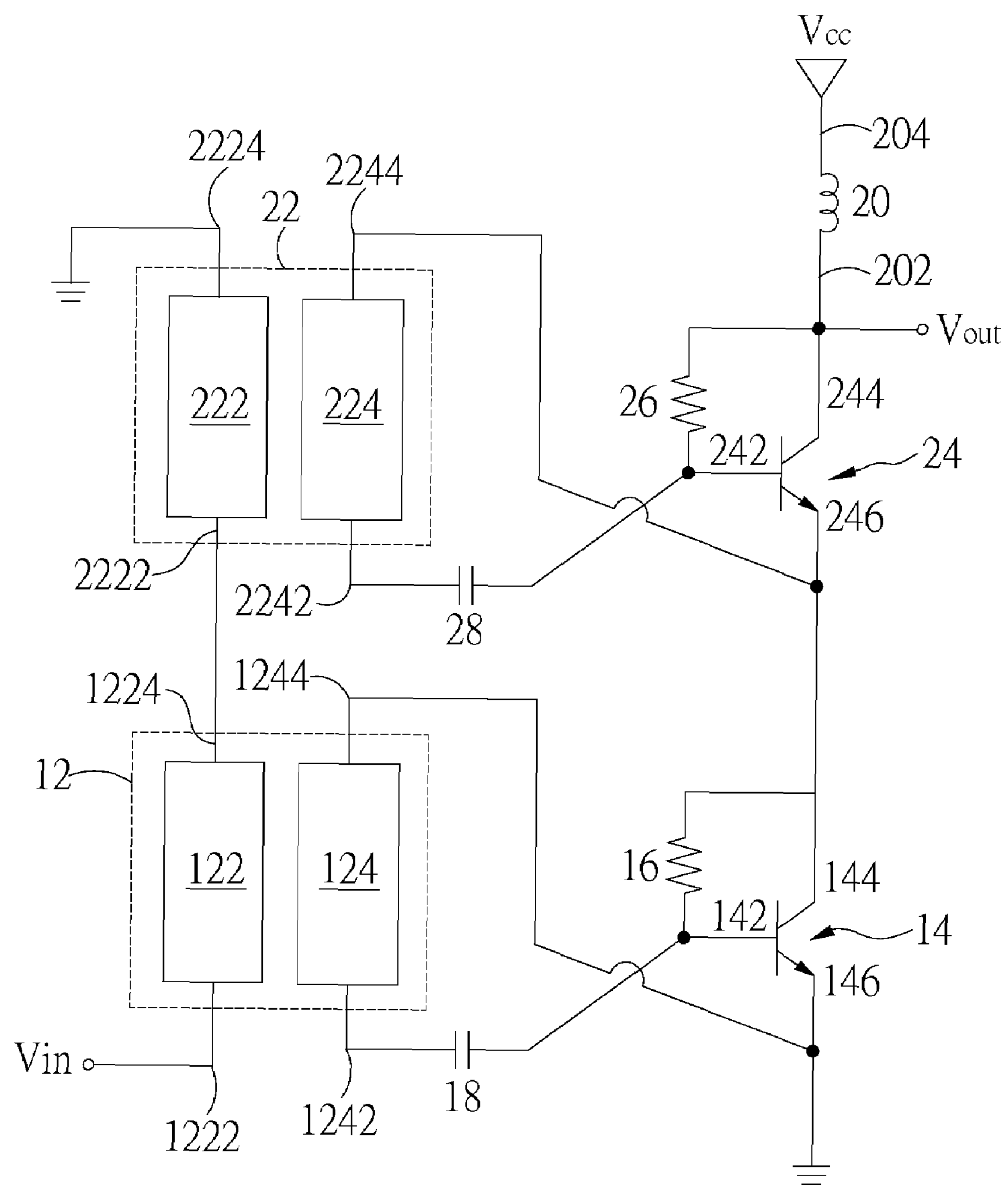
FIG. 1 is a circuit diagram of a power amplifier according to a preferred embodiment of the present invention.

FIG. 1 is a circuit diagram of a power amplifier 10 according to a preferred embodiment of the present invention. Referring to FIG. 1, the power amplifier 10 includes a first transformer 12, a first transistor 14, a first resistor 16, a second transformer 22, a second transistor 24, a second resistor 26, and a bias circuit 20.

The first transformer 12 includes a first primary coil 122 and a first secondary coil 124. A first end 1222 of the first primary coil 122 is used to receive an input signal Vin. The first transistor 14 includes a first base 142, a first collector 144 and a first emitter 146. The first base 142 is coupled to a first end 1242 of the first secondary coil 124, and the first emitter 146 is grounded and is coupled to a second end 1244 of the first secondary coil 124. The first resistor 16 is coupled between the first base 142 and the first collector 144 and serves as a bias resistor. Accordingly, the first transistor 14 would have a fixed relative voltage. The second transformer 22 includes a second primary coil 222 and a second secondary coil 224. A first end 2222 of the second primary coil 222 is coupled to a second end 1224 of the first primary coil 122. A second end 2224 of the second primary coil 222 is grounded. The second transistor 24 includes a second base 242, a second collector 244 and a second emitter 246. The second base 242 is coupled to a first end 2242 of the second secondary coil 224, and the second emitter 246 is coupled to the first collector 144 and a second end 2244 of the second secondary coil 224. The second collector 244 is used to generate an output signal Vout. The second resistor 26 is coupled between the second base 242 and the second collector 244 and serves as a bias resistor. As such, the second transistor 24 would have a fixed relative voltage. A first end 202 of the bias circuit 20 is coupled to the second collector 244 while a second end 204 of the bias circuit 20 is used to receive a supply voltage Vcc.

In a preferred embodiment of the present invention, the first transformer 12 (so is the second transformer 22) is a coupled line transformer. In terms of circuit layout, the coupled line transformer includes two metal lines. Currents fed into the coupled line transformer can be sensed by reducing a gap between the two metal lines. In addition, the coupled line transformer is designed to match approximately 50 ohms. The first transistor 14 (so is the second transistor 24) is sized such that the power amplifier 10 has a power load of about 50 ohms. Thereby, an additional matching circuit is not required in the power amplifier 10 of the present invention.

In a preferred embodiment of the present invention, the power amplifier 10 may further include a first capacitor 18 coupled between the first end 1242 of the first secondary coil 124 and the first base 142, and a second capacitor 28 coupled between the first end 2242 of the second secondary coil 224 and the second base 242. The first capacitor 18 and the second capacitor 28 are used as isolation capacitors for isolating DC current flowing towards the first base 142 of the first transistor 14 and the second base 242 of the second transistor 24, respectively. In addition, the bias circuit 20 can be an inductor.

Figure 2:
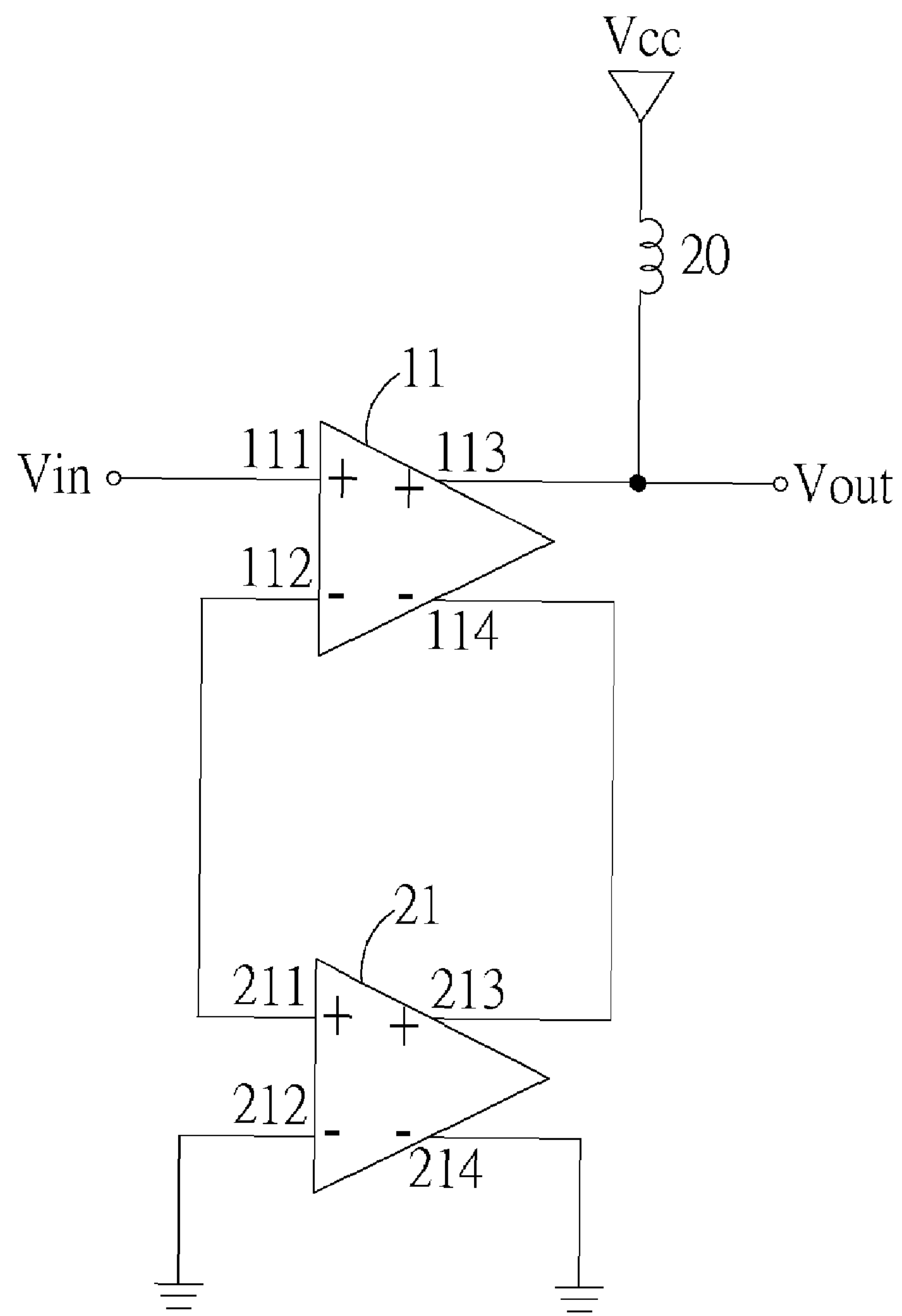
FIG. 2 is an equivalent circuit diagram of the power amplifier shown in FIG. 1.

In a preferred embodiment of the present invention, the first transformer 12 (so does the second transformer 22) can be used as a balun circuit, so as to transform the original single-ended input signal Vin into differential signals for being input to the first transistor 14 (or the second transistor 24). Thus, the power amplifier 10 of the present invention equivalently includes two differential input-differential output amplifiers 11 and 21 connected in series, as shown in FIG. 2. A positive input terminal 111 of the differential input-differential output amplifier 11 is used for receiving the input signal Vin while a positive output terminal 113 is used for outputting the output signal Vout. On the other hand, a positive input terminal 211 of the differential input-differential output amplifier 21 is coupled to a negative input terminal 112 of the differential input-differential output amplifier 11, a positive output terminal 213 of the differential input-differential output amplifier 21 is coupled to a negative output terminal 114 of the differential input-differential output amplifier 11, and a negative input terminal 212 and a negative output terminal 214 of the differential input-differential output amplifier 21 are both grounded.

Although the power amplifier 10 includes only two differential input-differential output amplifiers 11 and 21 in a preferred embodiment of the present invention, the power amplifier 10 may include more than two differential input-differential output amplifiers in other embodiments of the present invention. In other words, the power amplifier 10 may include additional sets of transformers, resistors, transistors and/or capacitors, to increase input impedance and output power.

Compared to the prior art, the power amplifier of the present invention has its input ends connected in series and its output ends connected in series. Thus, the power amplifier of the present invention can achieve good power combination efficiency and high input impedance and output power. In addition, good matching can be achieved by appropriately designing the transformers and transistors in the power amplifier of the present invention, even without a matching circuit.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A power amplifier, comprising:

a first transformer comprising a first primary coil for receiving an input signal, and a first secondary coil;

a first transistor comprising a first base, a first collector and a first emitter, the first emitter being coupled to a first end of the first secondary coil, and the first emitter being grounded and coupled to a second end of the first secondary coil;

a first resistor coupled between the first base and the first collector;

a second transformer comprising a second primary coil and a second secondary coil, a first end of the second primary coil being coupled to a second end of the first primary coil, and a second end of the second primary coil being grounded;

a second transistor comprising a second base, a second collector for generating an output signal, and a second emitter, the second base being coupled to a first end of the second secondary coil, and the second emitter being coupled to the first collector and a second end of the second secondary coil;

a second resistor coupled between the second base and the second collector; and a bias circuit having a first end coupled to the second collector, and a second end for receiving a supply voltage.

2. The power amplifier of claim 1, wherein the bias circuit is an inductor.

3. The power amplifier of claim 1, further comprising a first capacitor coupled between the first end of the first secondary coil and the first base.

* * * * *